United States Patent
Fung et al.

(10) Patent No.: US 8,502,316 B2
(45) Date of Patent: Aug. 6, 2013

(54) SELF-ALIGNED TWO-STEP STI FORMATION THROUGH DUMMY POLY REMOVAL

(75) Inventors: Ka-Hing Fung, Hsin-Chu (TW);
Han-Ting Tsai, Kaoshiung (TW);
Chun-Fai Cheng, Hsin-Chu (TW);
Haiting Wang, Hsin-Chu (TW);
Wei-Yuan Lu, Taipei (TW);
Hsien-Ching Lo, Taoyuan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 719 days.

(21) Appl. No.: 12/704,367

(22) Filed: Feb. 11, 2010

(65) Prior Publication Data

US 2011/0193167 A1    Aug. 11, 2011

(51) Int. Cl.
*H01L 29/72* (2006.01)

(52) U.S. Cl.
USPC .......... 257/350; 257/288; 257/368; 257/369; 257/506

(58) Field of Classification Search
USPC .......... 257/288, 350, 368, 369, 506
See application file for complete search history.

(56) References Cited

U.S. PATENT DOCUMENTS

| | | | |
|---|---|---|---|
| 5,874,328 A | 2/1999 | Liu et al. | |
| 6,927,114 B2 | 8/2005 | Park | |
| 7,230,270 B2 | 6/2007 | Chen et al. | |
| 7,405,131 B2 | 7/2008 | Chong et al. | |
| 7,446,026 B2 | 11/2008 | Zhang et al. | |
| 7,482,211 B2 | 1/2009 | Nieh et al. | |
| 7,538,387 B2 | 5/2009 | Tsai | |
| 7,602,021 B2 | 10/2009 | Doris et al. | |
| 7,605,407 B2 | 10/2009 | Wang | |
| 7,678,665 B2 | 3/2010 | Turner et al. | |
| 7,736,957 B2 | 6/2010 | Grudowski et al. | |
| 7,750,338 B2 | 7/2010 | Wang | |
| 7,838,887 B2 | 11/2010 | Woon et al. | |
| 7,943,961 B2 | 5/2011 | Wang et al. | |
| 7,947,546 B2 | 5/2011 | Liu et al. | |
| 7,972,916 B1 | 7/2011 | Connelly et al. | |
| 8,017,487 B2 | 9/2011 | Chong et al. | |
| 8,193,065 B2 | 6/2012 | Johnson et al. | |
| 2002/0113288 A1 | 8/2002 | Clevenger et al. | |
| 2004/0171197 A1 | 9/2004 | Park | |
| 2006/0086987 A1 | 4/2006 | Chen et al. | |
| 2006/0108644 A1 | 5/2006 | Chen et al. | |

(Continued)

FOREIGN PATENT DOCUMENTS

| CN | 1525552 A | 9/2004 |
|---|---|---|
| CN | 1797762 A | 7/2006 |

*Primary Examiner* — Edward Wojciechowicz
(74) *Attorney, Agent, or Firm* — Slater & Matsil, L.L.P.

(57) ABSTRACT

An integrated circuit structure includes a semiconductor substrate including an active region. A first shallow trench isolation (STI) region adjoins a first side of the active region. A gate electrode of a MOS device is over the active region and the first STI region. A source/drain stressor region of the MOS device includes a portion in the semiconductor substrate and adjacent the gate electrode. A trench is formed in the semiconductor substrate and adjoining a second side of the active region. The trench has a bottom no lower than a bottom of the source/drain region. An inter-layer dielectric (ILD) extends from over the gate electrode to inside the trench, wherein a portion of the ILD in the trench forms a second STI region. The second STI region and the source/drain stressor region are separated from each other by, and adjoining, a portion of the semiconductor substrate.

20 Claims, 11 Drawing Sheets

U.S. PATENT DOCUMENTS

| | | |
|---|---|---|
| 2007/0066030 A1 | 3/2007 | Kim |
| 2008/0157200 A1 | 7/2008 | Kim et al. |
| 2008/0265365 A1 | 10/2008 | Frohberg et al. |
| 2009/0278201 A1 | 11/2009 | Chatty et al. |
| 2009/0298248 A1* | 12/2009 | Fung .......................... 438/296 |
| 2010/0047985 A1 | 2/2010 | Dakshina Murthy et al. |
| 2011/0031541 A1 | 2/2011 | Fung |
| 2011/0079820 A1 | 4/2011 | Lai et al. |
| 2011/0223737 A1 | 9/2011 | Liu et al. |
| 2011/0303980 A1 | 12/2011 | Sultan et al. |

* cited by examiner

SELF-ALIGNED TWO-STEP STI FORMATION THROUGH DUMMY POLY REMOVAL

TECHNICAL FIELD

This disclosure relates generally to integrated circuits, and more particularly to the formation of isolation structures for separating integrated circuits.

BACKGROUND

Modern integrated circuits are formed on the surfaces of semiconductor substrates, which are mostly silicon substrates. Semiconductor devices are isolated from each other by isolation structures formed close to the surface of the respective semiconductor substrates. The isolation structures include field oxides and shallow trench isolation (STI) regions.

Field oxides are often formed using local oxidation of silicon (LOCOS). A typical formation process includes blanket forming a mask layer on a silicon substrate and then patterning the mask layer to expose certain areas of the underlying silicon substrate. A thermal oxidation is then performed in an oxygen-containing environment to oxidize the exposed portions of the silicon substrate. The mask layer is then removed.

With the down-scaling of integrated circuits, STI regions are increasingly used as the isolation structures. FIG. 1 illustrates a top view of an integrated circuit structure, which includes metal-oxide-semiconductor (MOS) devices 102 and 112. MOS device 102 includes gate poly 104 formed over active region 106. MOS device 112 includes gate poly 114 formed over active region 116. Active regions 106 and 116 are separated from each other and from other devices by STI regions 108, which include STI strips $108_1$ parallel to the gate length direction (source-to-drain direction) of MOS devices 102 and 112, and STI strips $108_2$ parallel to the gate width direction.

The formation of STI regions 108 is typically performed before the formation of MOS devices. During the subsequent high-temperature process steps, which may be performed at temperatures as high as about 700° C., stresses are generated due to the different coefficients of thermal expansion between STI regions 108 and active regions 106 and 116. STI regions 108 thus apply stresses to active regions 106 and 116 and adversely affect the performance of MOS devices 102 and 112. In addition, the formation of source/drain regions requires dopant implantations. In the portions of active regions 106 and 116 near STI regions 108, dopant concentrations may have fluctuations due to the diffusion of the dopants into STI regions 108.

FIG. 2 illustrates a cross-sectional view of a conventional structure. To solve the micro-loading effect, dummy polysilicon strip 120 is added over STI region 108. Dummy polysilicon strip 120 is located between polysilicon strips 104 and 114. In the source and drain regions of MOS devices 102 and 112, epitaxial regions 122 are formed by etching into substrate 124 to form recesses in substrate 124, and epitaxially growing a semiconductor material, such as silicon germanium (SiGe) in the recesses. However, since SiGe tends not to grow on STI region 108, facets 126 are formed. In addition, dummy polysilicon strip 120 has parasitic capacitance with polysilicon strips 104 and 114, both resulting in the degradation of MOS devices 102 and 112.

SUMMARY

In accordance with one aspect, an integrated circuit structure includes a semiconductor substrate including an active region. A first shallow trench isolation (STI) region adjoins a first side of the active region. A gate electrode of an MOS device is over the active region and the first STI region. A source/drain stressor region of the MOS device includes a portion in the semiconductor substrate and adjacent the gate electrode. A trench is formed in the semiconductor substrate and adjoining a second side of the active region. The trench has a bottom no lower than a bottom of the source/drain region. An inter-layer dielectric (ILD) extends from over the gate electrode to inside the trench, wherein a portion of the ILD in the trench forms a second STI region. The second STI region and the source/drain stressor region are separated from each other by, and adjoining, a portion of the semiconductor substrate.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative, and do not limit the scope of the present disclosure.

A novel method for forming shallow trench isolation (STI) regions and the resulting structures is provided. The intermediate stages of manufacturing an embodiment are illustrated. The variations of the embodiment are then discussed. Throughout the various views and illustrative embodiments, like reference numbers are used to designate like elements.

Figure 1:
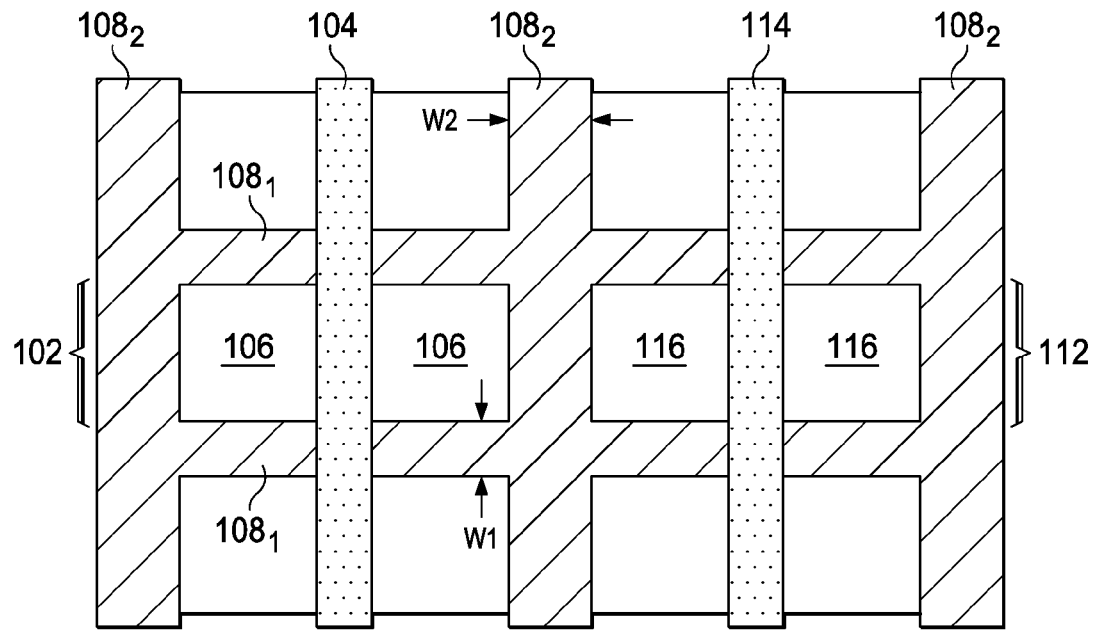
FIG. 1 illustrates a top view of a conventional integrated circuit structure, wherein metal-oxide-semiconductor (MOS) devices are isolated from each other by shallow trench isolation (STI) regions.
Figure 2:
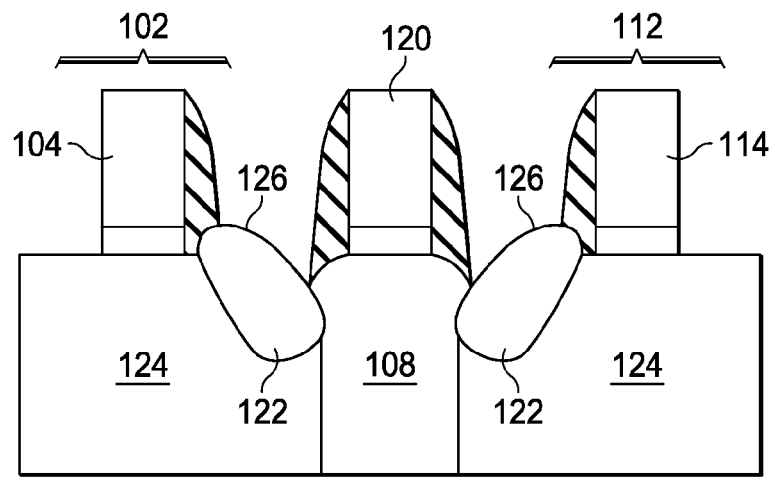
FIG. 2 illustrates a cross-sectional view of a conventional structure, wherein stressor regions of MOS devices have facets.
Figure 3A:
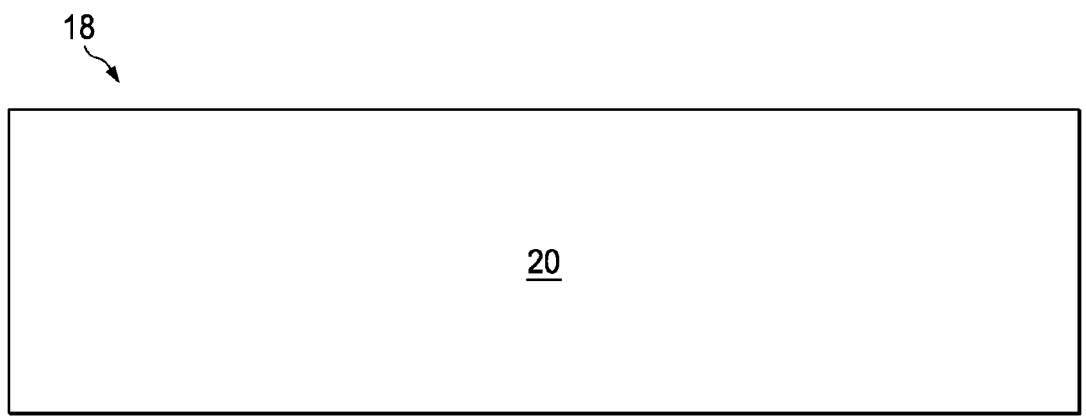
FIGS. 3A through 8C are cross-sectional views and top views of intermediate stages in the manufacturing of an integrated circuit structure in accordance with an embodiment.
Figure 3B:
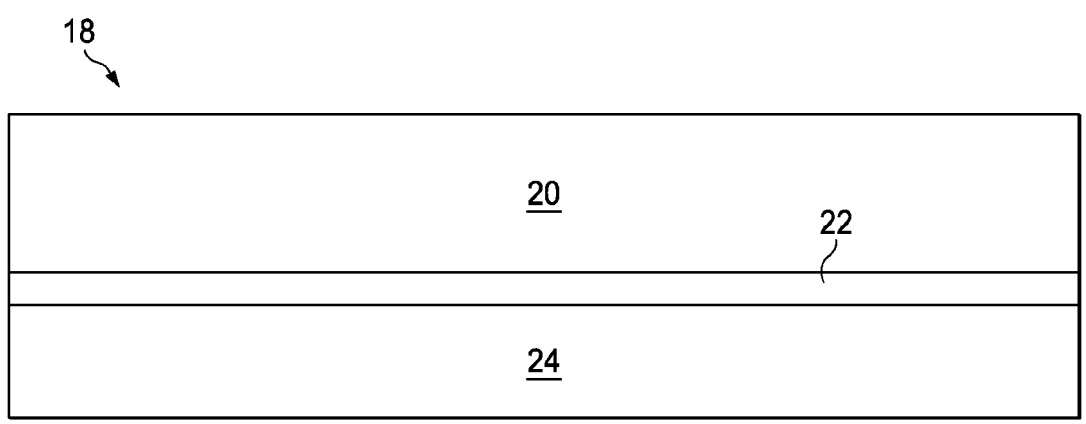

FIGS. 3A and 3B are cross-sectional views of semiconductor wafer 18, which include semiconductor substrate 20. In an embodiment, as illustrated in FIG. 3A, semiconductor substrate 20 is formed of a bulk semiconductor material, such as silicon. In alternative embodiments, as illustrated in FIG. 3B, semiconductor wafer 18 has a semiconductor-on-insulator (SOI) structure, with semiconductor substrate 20 located on a buried oxide (BOX) layer 22, which is further located on semiconductor layer 24.

Figure 4A:
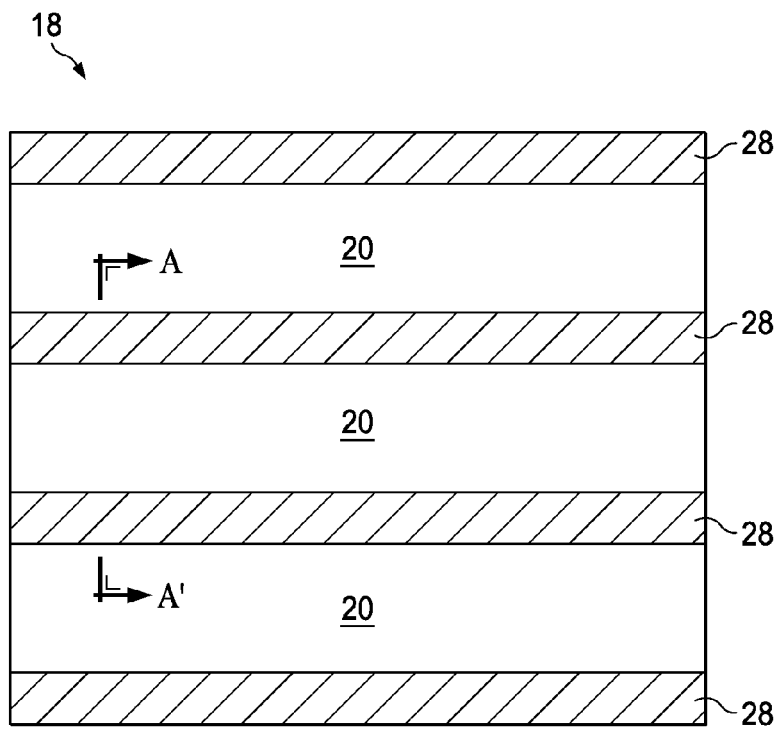
Figure 4B:
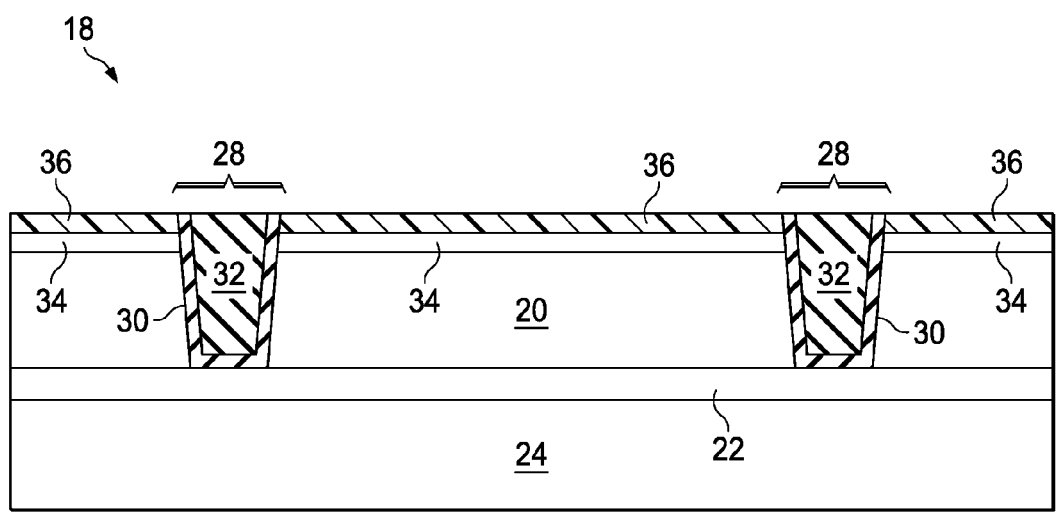
Figure 4C:
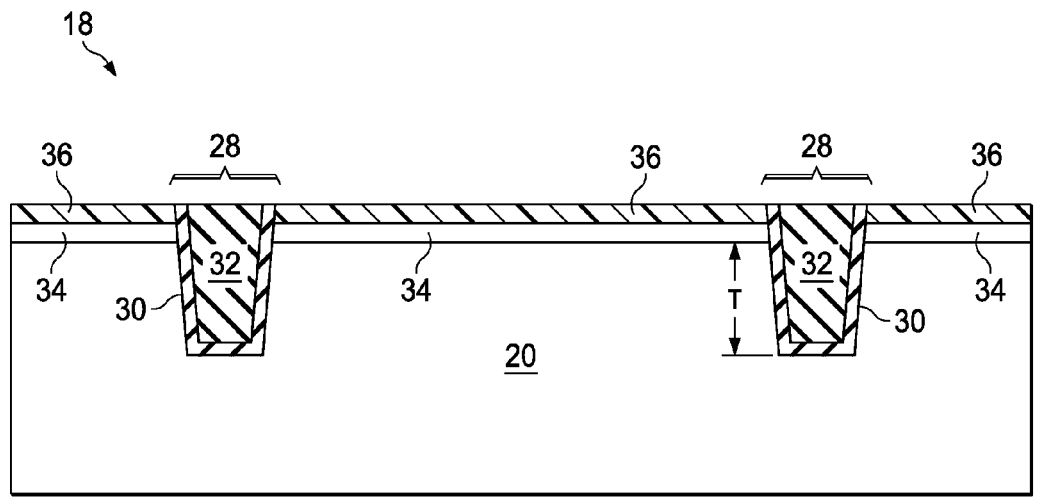

FIG. 4A illustrates a top view of the formation of STI regions 28, which are in semiconductor wafer 18. In the illustrated region of semiconductor wafer 18, a plurality of parallel STI regions 28 is formed. FIG. 4B illustrates a cross-sectional view of the structure shown in FIG. 4A, wherein the cross-sectional view is taken along a plane crossing line A-A' in FIG. 4A. An exemplary formation process of STI regions 28 is briefly discussed as follows with reference to FIG. 4B. First, pad layer 34 and hard mask layer 36 are formed on substrate 20, followed by the formation of trenches (the spaces occupied by STI regions 28). The trenches may be formed by anisotropic plasma etching, for example, using fluorine-containing chemicals. In the case semiconductor wafer 18 has an SOI structure, the trenches may have a depth equal to the depth of the semiconductor substrate 20, so that the subsequently formed STI regions 28 physically contact BOX layer 22. FIG. 4C illustrates the embodiment wherein the substrate is a bulk semiconductor substrate.

Next, trench liners 30 are formed in the trenches, using thermal oxidation. Accordingly, trench liners 30 may include silicon oxide, although other dielectric materials may also be used. Next, dielectric material 32 is filled into the remaining portion of the trenches. In an embodiment, dielectric material 32 includes un-doped oxide material. The filling of dielectric material 32 may be performed using high-density plasma chemical vapor deposition (HDPCVD). However, other commonly used methods, such as high aspect-ratio process (HARP), sub-atmospheric CVD (SACVD) and spin-on can also be used. A chemical mechanical polish (CMP) is then performed to remove excess dielectric material 32 over hard mask 36. Next, hard mask 36 and pad layer 34 are removed, leaving STI regions 28 in the trenches.

Figure 5A:
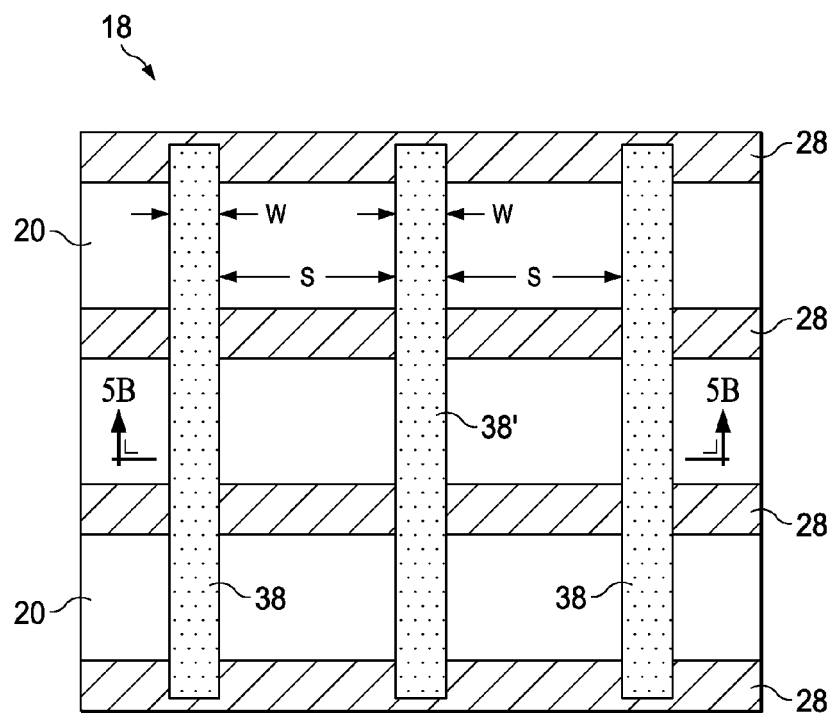
Figure 5B:
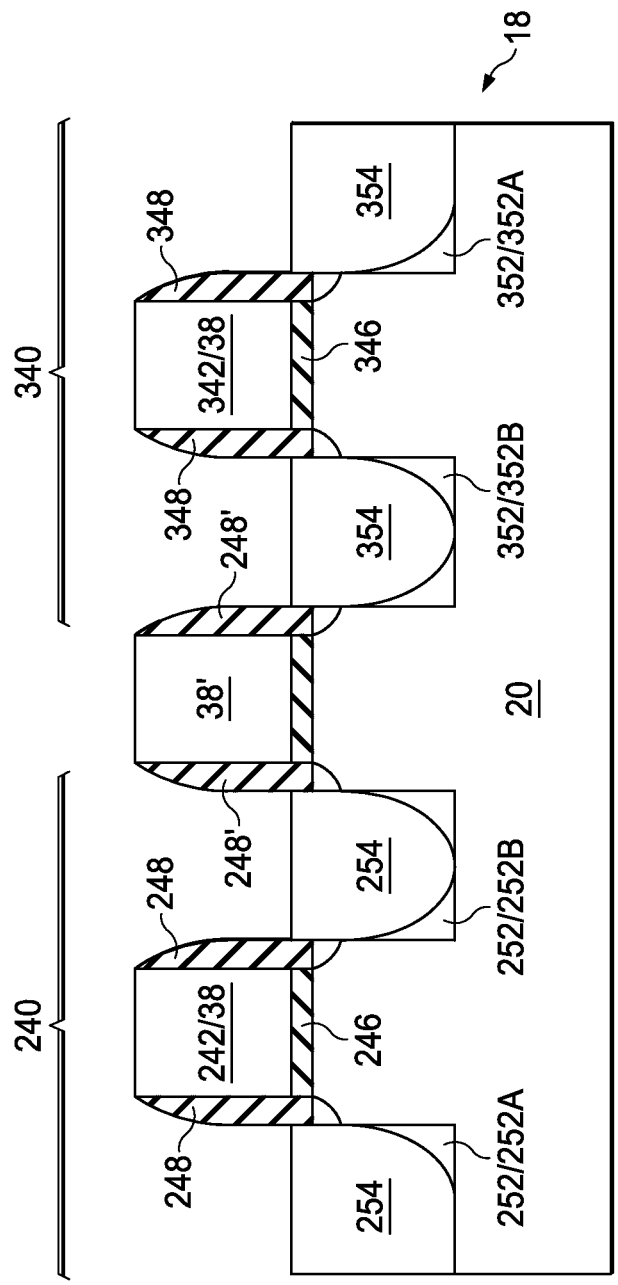

Next, as shown in FIGS. 5A and 5B, gate electrodes 38 (and underlying gate dielectrics 246 and 346) and dummy gate electrode 38' (alternatively referred to as a dummy poly) are formed, wherein gate electrodes 38 form portions of the resulting MOS devices 240 and 340. Dummy gate electrodes 38' may not be electrically connected to any active device, such as transistors. In an exemplary embodiment as shown in FIG. 5B, MOS devices 240 and 340 are PMOS devices. In alternative embodiments, MOS devices 240 and 340 are NMOS devices. In yet other embodiments, MOS devices 240 and 340 include one PMOS device and one NMOS device. Gate electrodes 38 and dummy gate electrode 38' may have their lengthwise directions parallel to each other. Further, gate electrodes 38 and dummy gate electrode 38' may have a same width W, and may be spaced apart from each other by the same spacing S.

FIG. 5B is a cross-sectional view of the structure shown in FIG. 5A, wherein the cross-sectional view is obtained in a plane crossing line 5B-5B in FIG. 5A. MOS device 240 includes gate 242 (a portion of one of the gate electrodes 38), gate dielectric 246, gate spacers 248, and stressor regions 252 (including 252A and 252B). MOS device 340 includes gate 342 (a portion of one of the gate electrodes 38), gate dielectric 346, gate spacers 348, and stressor regions 352 (including 352A and 352B). Source/drain regions 254 and 354 may be formed in stressor regions 252 and 352 by implanting appropriate p-type or n-type impurities. Stressor regions 252 and/or 352 may be formed of silicon germanium (SiGe), silicon carbon (SiC) or the like, depending on the type of MOS devices 240 and 340, respectively. Dummy gate spacers 248' are formed on sidewalls of dummy gate electrode 38'. The formation of stressor regions 252 and 352 may include etching into semiconductor substrate 20 to form recesses in semiconductor substrate 20, and then performing an epitaxial growth to re-grow stressor regions 252 and 352. Accordingly, sidewalls of stressor regions 252B/352B may be substantially vertically aligned to edges of respective gate spacers 248/348 and dummy gate spacers 248'. The formation of MOS devices 240 and 340 may include several high-temperature processes, such as the activation of source/drain regions 254 and 354. During the high-temperature steps, the temperatures may be as high as about 700° C. Dummy gate spacers 248' are formed on the sidewalls of dummy gate electrode 38'.

Figure 6:
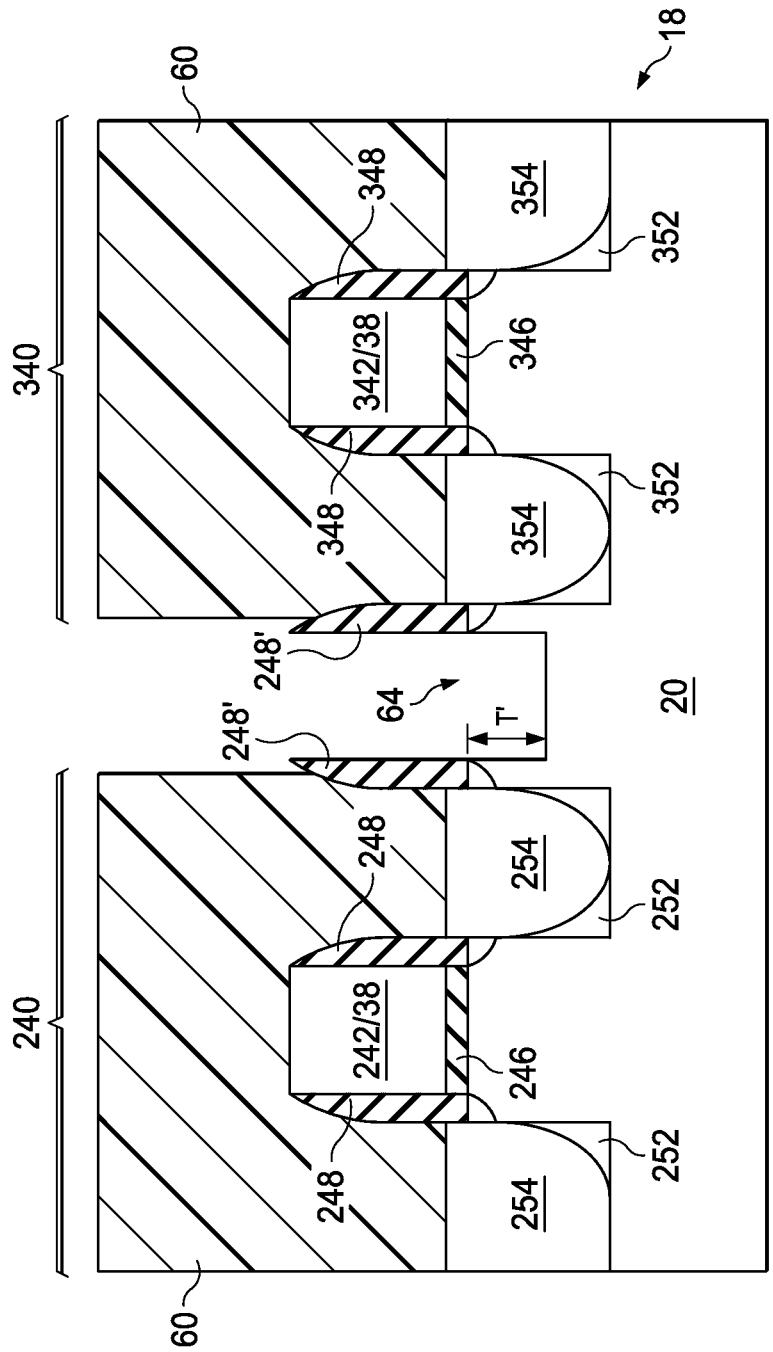

Referring to FIG. 6, mask 60, which may be formed of a photo resist, is formed to cover MOS devices 240 and 340, while dummy gate electrode 38' (as shown in FIG. 5B) is exposed. Portions of dummy gate spacers 248' may also be exposed to increase the process window. Next, an etching is performed to remove dummy gate electrode 38' and the dummy gate dielectric (if any) under dummy gate electrode 38' to form an opening. The etching is continued to extend the opening downwardly, so that the exposed portions of substrate 20 is also etched, forming trench 64 in semiconductor substrate 20. The etching may be performed using an etchant having a high etching selectivity so that dummy gate spacers 248' is not etched. Further, in the etching of semiconductor substrate 20, an anisotropic etching may be used.

In the embodiments semiconductor wafer 18 has the SOI structure as shown in FIG. 3B, trench 64 may extend deep enough so that BOX layer 22 is exposed. In the case, semiconductor wafer 18 is a bulk substrate. Trench 64 has depth T', which may be greater than, equal to, or smaller than depth T of STI regions 28 (refer to FIG. 4C). In an exemplary embodiment, depth T' is less than about 20 percent, or even less than about 10 percent depth T. Further, trench 64 may be shallower than the bottom of stressor regions 252 and 352 without noticeably affecting the isolation performance. In alternative embodiments, depth T' may be equal to or greater than depth T.

The formation of trench 64 is self-aligned, and the locations and the sizes of trench 64 are defined by the locations and the sizes of gate spacers 248/348 and dummy gate spacers 248'. In the embodiments wherein all gate electrodes and dummy gate electrodes are parallel and evenly spaced with equal distances therebetween, for example, in 22 nm technology or under, the resulting trench 64 will also be parallel to, and evenly spaced with, gate electrodes 38.

Figure 7:
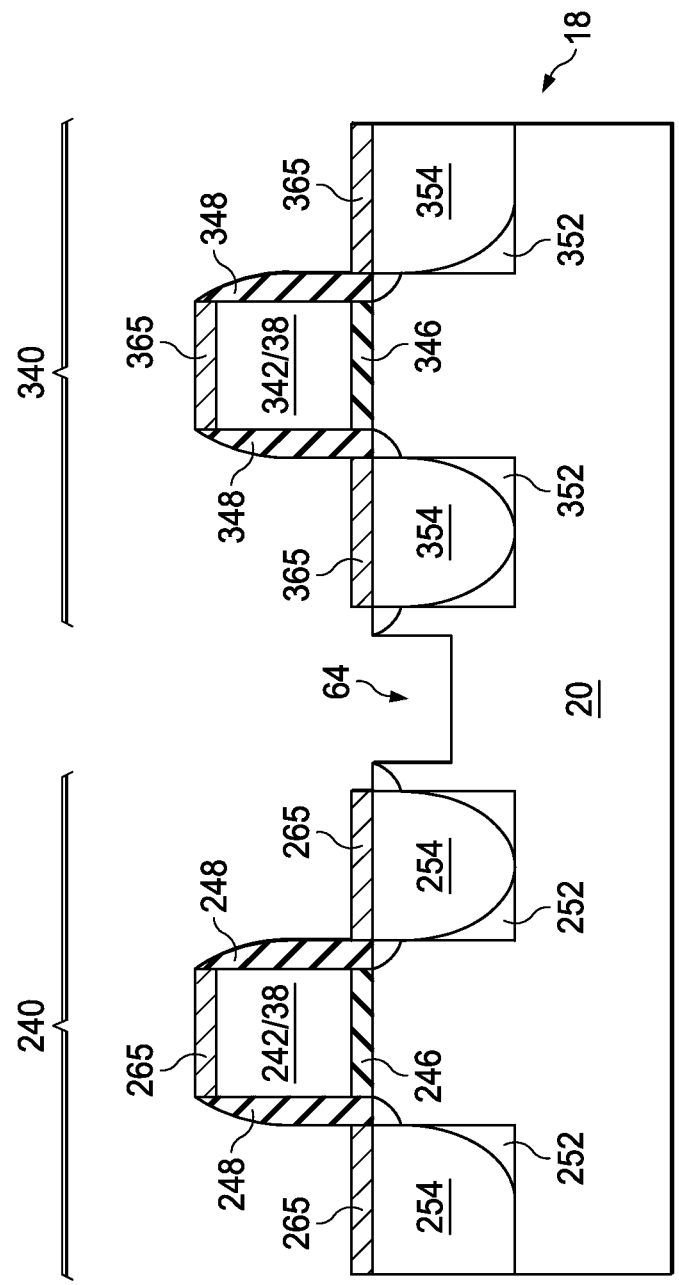

Referring to FIG. 7, dummy gate spacers 248' and mask 60 are also removed. In an embodiment, after the removal of mask 60, gate silicides and source/drain silicides 265 and 365 are formed. In an alternative embodiment, the formation of gate silicides and source/drain silicides 265 and 365 may be performed before the formation of mask 60 and trench 64.

Figure 8A:
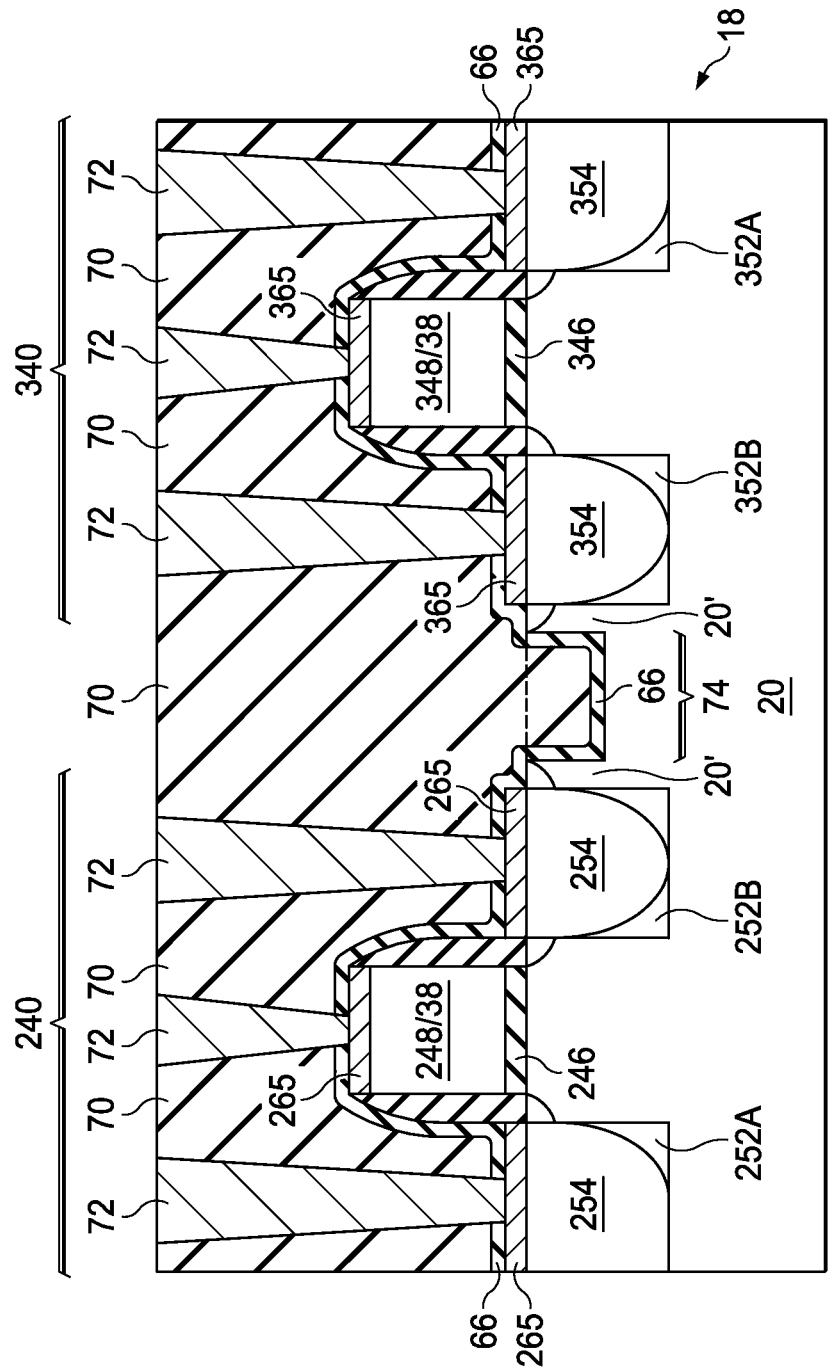

FIG. 8A illustrates the formation of contact etch stop layer (CESL) 66, inter-layer dielectric (ILD) 70, and contact plugs 72. Contact etch stop layer 66 is first blanket formed, followed by the formation of ILD 70. CESL 66 may be formed of silicon nitride or other materials, such as silicon oxy-nitride. As is known in the art, CESL 66 may apply a stress to the underlying MOS devices 240 and 340 to improve the carrier mobility. ILD 70 may include silicon oxide formed using, for example, SACVD. Alternatively, ILD 70 may include doped oxide materials, such as boronphosphosilicate glass (BPSG), phosphosilicate glass (PSG), or the like. Relatively low-temperatures may be used for the formation of CESL 66 and ILD 70, wherein the temperatures may be about 450° C. or lower, for example, about 400° C. CESL 66 and ILD 70 extend into trench 64. Throughout the description, the portions of CESL 66 and ILD 70 underlying the top surface of silicon substrate 20 are referred to as STI region 74. It is observed that STI region 74 is spaced apart from stressor regions 252B and 352B by extension portions 20' of substrate 20.

Figure 8B:
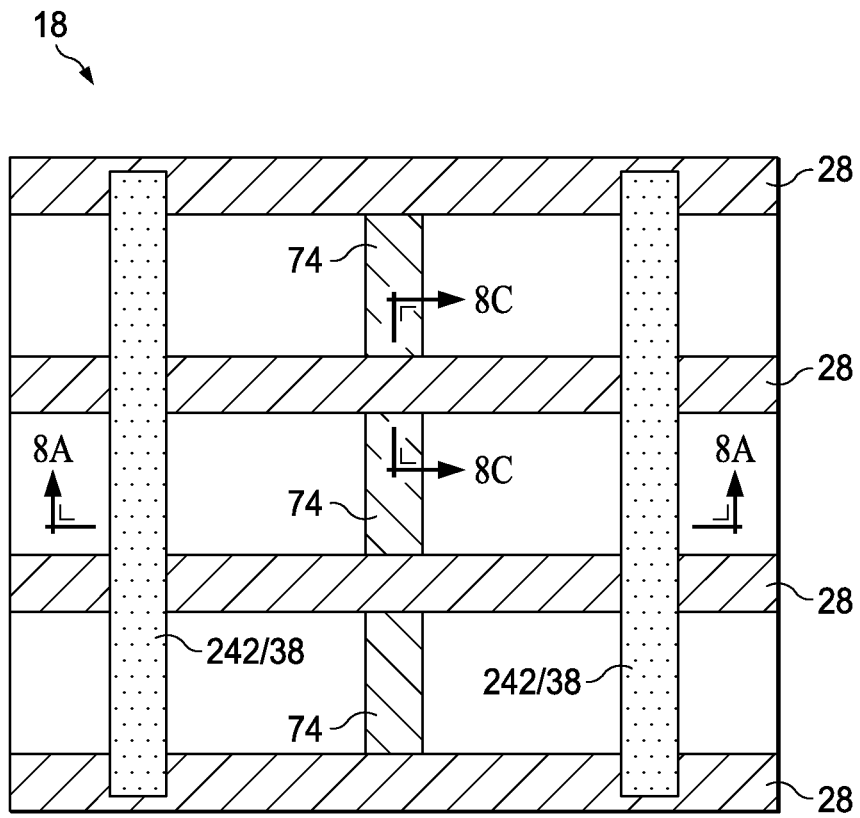

FIG. 8B illustrates a top view of the structure shown in FIG. 8A, and the cross-sectional view shown in FIG. 8A is taken along the plane crossing line 8A-8A as shown in FIG. 8B. The top view shows that gate electrode strips 38 crossing over STI regions 28, while STI regions 74 do not cross any gate electrode strip. Since in the formation of trench(es) 64 (FIG. 7), the etchant may be selected so that STI regions 28 are not etched even if they are exposed through mask 60 (FIG. 6), the locations of STI regions 74 are defined by the boundaries of the respective wells in substrate 20, and hence are within-well STI regions.

Figure 8C:
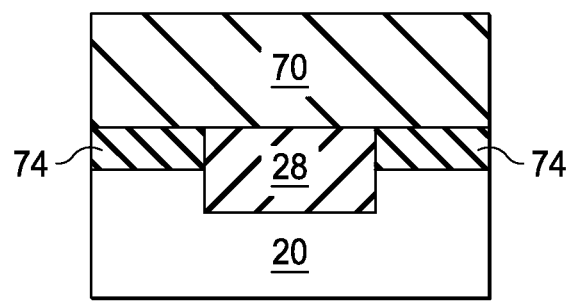

Referring back to FIG. 8A, contact openings (occupied by contact plugs 72) are formed in ILD 70 and CESL 66 to expose gate silicide regions and source/drain silicide regions 265 and 365. Contact plugs 72 are then formed in the contact openings. Contact plugs 72 may include tungsten. FIG. 8C illustrates a cross-sectional view of the structure shown in FIG. 8B, wherein the cross-sectional view is obtained from the plane crossing line 8C-8C in FIG. 8B. It is observed that a sidewall of an STI region 74 may contact a sidewall of STI region 28.

Figure 9:
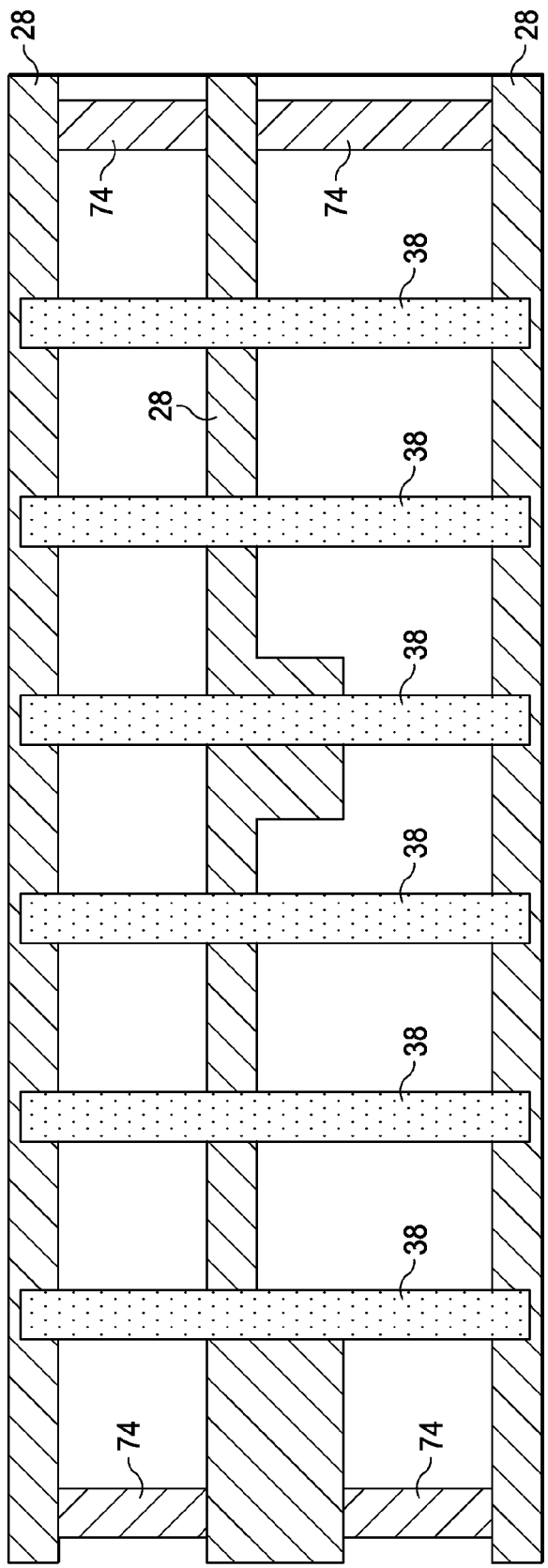
FIG. 9 illustrates a top view of an integrated circuit structure, wherein STI regions have irregular shapes.

Referring to FIG. 9, STI regions 28 and/or STI regions 74 may not (or may) form rectangular patterns. However, the same teaching applies, and the portions of STI regions having no gate electrode strips formed thereon may be formed using the same methods, and formed simultaneously as, STI regions 74, while the portions of STI regions having gate electrode strips formed thereon may be formed using the same methods, and formed simultaneously as, STI regions 28. Further, irregular shaped STI regions may need to be formed simultaneously as (and actually are) STI regions 28, while strip-shaped (rectangular) STI regions may be formed simultaneously as (and actually become) STI regions 74.

Figure 10:
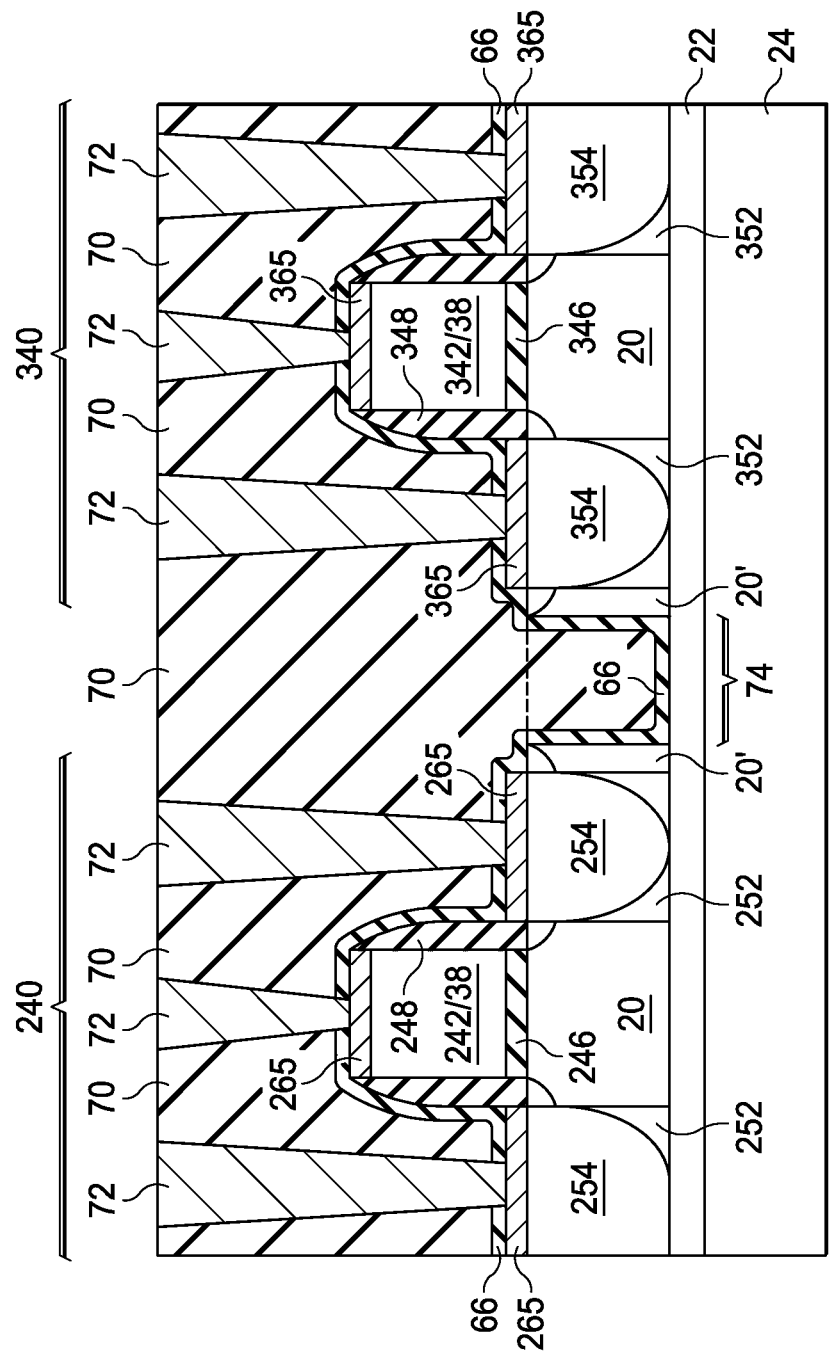
FIG. 10 illustrates a cross-sectional view of an integrated circuit structure in accordance with an alternative embodiment.

FIG. 10 illustrates yet another embodiment in which an SOI substrate is used. Accordingly, STI regions 74 may extend to and contact BOX layer 22. Again, it is observed that extension portions 20' of semiconductor substrate 20 physically separate STI regions 74 from stressor regions 252 and 352.

In the embodiments, referring to FIG. 8A, it is observed that since stressor regions 252B and 352B are grown with silicon on opposite sides, substantially no facet is formed, and the top surfaces of stressor regions 252A/252B and 352A/352B are substantially flat. Dummy gate electrodes 38' are removed in the formation process of STI regions 74. Therefore, the parasitic capacitance resulted from dummy gate electrodes 38' is also eliminated, and the adverse stresses caused by traditional STI regions may also be reduced. In addition, the active areas may be increased (refer to extension portions 20' of substrate 20 in FIG. 8A), which results in the increased density of active areas. The dopant fluctuation may also be reduced.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An integrated circuit structure comprising:
   a semiconductor substrate comprising an active region;
   a first shallow trench isolation (STI) region adjoining a first side of the active region;
   a gate electrode of an MOS device over the active region and the first STI region;
   a source/drain stressor region of the MOS device comprising a portion in the semiconductor substrate and having a vertical side substantially aligned with a vertical side of the gate electrode;
   a trench in the semiconductor substrate and adjoining a second side of the active region, wherein the trench has a bottom no lower than a bottom of the source/drain stressor region; and
   an inter-layer dielectric (ILD) extending from over the gate electrode to inside the trench, wherein a portion of the ILD in the trench forms a second STI region, wherein the second STI region and the source/drain stressor region are separated from each other by, and adjoining, a portion of the semiconductor substrate.

2. The integrated circuit structure of claim 1, wherein the second STI region and the gate electrode have substantially a same width.

3. The integrated circuit structure of claim 1, wherein the second STI region and the gate electrode have lengthwise directions parallel to each other.

4. The integrated circuit structure of claim 3, wherein an end of the second STI region adjoins a sidewall of the first STI region.

5. The integrated circuit structure of claim 1 further comprising a contact etch stop layer (CESL) underlying the ILD, wherein portions of the CESL on sidewalls and a bottom of the trench form portions of the second STI region.

6. The integrated circuit structure of claim 1 further comprising a buried oxide layer underlying the semiconductor substrate, wherein the first and the second STI regions are in contact with the buried oxide layer.

7. The integrated circuit structure of claim 1, wherein the semiconductor substrate is a bulk substrate, and wherein the first and the second STI regions extend to different depths in the semiconductor substrate.

8. The integrated circuit structure of claim 1, wherein the first and the second STI regions comprise different materials.

9. An integrated circuit structure comprising:
   a semiconductor substrate comprising an active region;
   a first shallow trench isolation (STI) region adjoining a first side of the active region;
   a metal-oxide-semiconductor (MOS) device comprising:
      a gate stack on the active region and the first STI region;
      a source/drain region adjacent the gate stack and in a portion of the active region; and
   a second STI region parallel to a second side of the active region perpendicular to the first side, wherein the first and the second STI regions have different depths, and wherein the second STI region and the source/drain region are separated from each other by, and adjoining, an extension portion of the semiconductor substrate.

10. The integrated circuit structure of claim 9 further comprising an inter-layer dielectric (ILD), wherein the ILD and the second STI region are formed of a same material, and form a continuous region with no different materials therebetween.

11. The integrated circuit structure of claim 10 further comprising a contact etch stop layer (CESL) underlying the ILD, wherein portions of the CESL form sidewall portions and a bottom portion of the second STI region.

12. The integrated circuit structure of claim 9, wherein the first and the second STI regions comprise different materials.

13. The integrated circuit structure of claim 9, wherein the first and the second STI regions are formed of a same material, and have different densities.

14. The integrated circuit structure of claim 9, wherein a sidewall of the first STI region contacts a sidewall of the second STI region.

15. An integrated circuit structure comprising:
   a semiconductor substrate comprising an active region;
   a first shallow trench isolation (STI) region adjoining a first side of the active region;
   a metal-oxide-semiconductor (MOS) device comprising:
      a gate stack on the active region and the first STI region; and
      a source/drain region adjacent the gate stack and in a portion of the active region; and
   a second STI region parallel to a second side of the active region perpendicular to the first side, wherein the first and the second STI regions are formed of different materials.

16. The integrated circuit structure of claim 15, wherein the first and the second STI regions have different depths.

17. The integrated circuit structure of claim 15 further comprising a stressor region comprising a portion in the active region, wherein a portion of the stressor region forms a portion of the source/drain region, and wherein the second STI region and the stressor region are separated from each other by, and adjoining, an extension portion of the semiconductor substrate.

18. The integrated circuit structure of claim 15 further comprising an inter-layer dielectric (ILD) having a top surface higher than a top surface of the gate stack, wherein the ILD and at least a portion of the second STI region are formed of a same material.

19. The integrated circuit structure of claim 18 further comprising a contact etch stop layer (CESL) extending from directly over the source/drain region to underlying the ILD, wherein portions of the CESL form sidewall portions and a bottom portion of the second STI region.

20. The integrated circuit structure of claim 15, wherein a sidewall of the first STI region contacts a sidewall of the second STI region.

* * * * *